United States Patent [19]

Itoh

[11] Patent Number: 5,231,592
[45] Date of Patent: Jul. 27, 1993

[54] COUNTER

[75] Inventor: Kazuhiko Itoh, Tokyo, Japan

[73] Assignee: Oki Electric Industry Co., Ltd., Tokyo, Japan

[21] Appl. No.: 577,903

[22] Filed: Sep. 5, 1990

[30] Foreign Application Priority Data

Sep. 6, 1989 [JP] Japan .................. 1-229280

[51] Int. Cl.$^5$ ............................ G06M 3/00
[52] U.S. Cl. ........................ 364/550; 377/26
[58] Field of Search ........... 364/550, 555; 377/15, 377/26

[56] References Cited

U.S. PATENT DOCUMENTS

| | | | |
|---|---|---|---|
| 4,774,544 | 9/1988 | Tsuchiya et al. | 377/15 X |
| 4,885,943 | 12/1989 | Tottell et al. | 73/861.77 |
| 5,023,813 | 6/1991 | Brown, III | 364/900 X |
| 5,103,409 | 4/1992 | Shimizu et al. | 364/550 X |

*Primary Examiner*—Edward R. Cosimano
*Attorney, Agent, or Firm*—Edward D. Manzo

[57] ABSTRACT

A counter has an electrically erasable and programmable read-only memory (EEPROM), a write circuit, and a read circuit. The EEPROM, which can be rewritten at least V times, is divided into count areas $M_O, \ldots, M_N$ each capable of storing count values from zero to V, and a number area for storing a number K from zero to N identifying the count area currently in use. The write circuit uses the count areas $M_O, \ldots, M_N$ in succession to store counts as high as $N \times V$. The read circuit obtains the current count value by reading K from the number area, reading the contents C of the Kth count area $M_K$, and calculating $C+(V \times K)$.

11 Claims, 3 Drawing Sheets

COUNT WRITING PROCEDURE

COUNT WRITING PROCEDURE

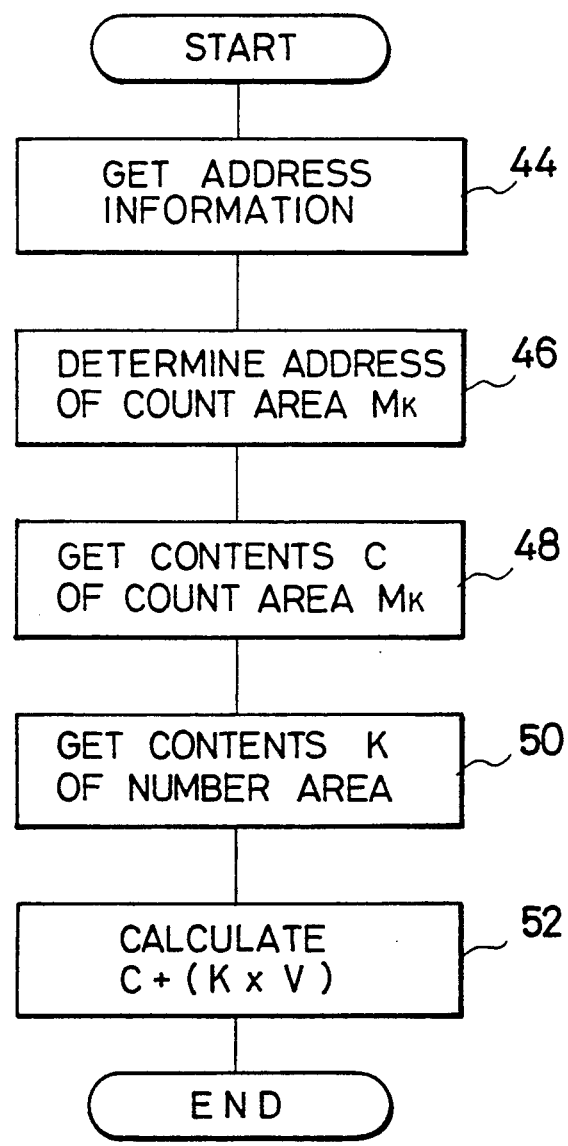

COUNTER

BACKGROUND OF THE INVENTION

This invention relates to a counter for counting repetitive phenomena, such as the number of pages printed by a page printer.

Electrophotographic page printers and copiers are equipped with counters that count the cumulative number of pages or copies printed to determine replacement times for supplies and components such as toner and photosensitive drums, or to indicate when the printer or copier is at the end of its service life. Examples of counters employed in the prior art include mechanical counters, electronic counters using a battery-backed-up memory to store the count value, and electronic counters using a floppy disk to store the count value. These prior-art counters are expensive, and are inconveniently large.

Counts can more conveniently be kept in an electrically erasable and programmable read-only memory (EEPROM), which does not require battery back-up. Current EEPROMs, however, can be rewritten only about ten to twenty thousand times, which is far less than the number of pages printed by a page printer or copier during its service life. For this reason, EEPROM-based counters have not been used.

SUMMARY OF THE INVENTION

It is accordingly an object of the present invention to provide a compact, inexpensive counter capable of counting up to high values.

The invented counter has an EEPROM with memory cells capable of being rewritten at least V times, where V is a positive integer. The EEPROM comprises count areas $M_O, M_1, \ldots, M_N$ each having sufficient memory cells to store integer values from zero to V. The EEPROM also includes a number area having sufficient memory cells to store integer values from zero to N, where N is a positive integer. When the counter receives a value A from a sensor, a write circuit in the counter adds A to the contents C of the K-th count area $M_K$, where K is the integer stored in the number area. If $C+A<V$, the write circuit write the sum $C+A$ back to the K-th count area $M_K$. If $C+A \geq V$, the writes circuit writes $C+A-V$ in the $(K+1)$th count area $M_{K+1}$ and writes $K+1$ in the number area. When the current count value is required, a read circuit in the counter reads the contents K of the number area and the contents C of the K-th count area $M_K$, calculates $C+(K \times V)$, and provides this value as output.

BRIEF DESCRIPTION OF THE DRAWINGS

FIG. 3 is a flowchart of the count reading procedure.

DETAILED DESCRIPTION OF THE INVENTION

A novel counter for counting phenomena detected by a sensor will be described with reference to the drawings. The sensor may be any device that provides a value A to be added to the count stored in the counter. In the case of a page printer or copier, the sensor is a device that counts pages one by one, providing a value A of one for each page, the value A thus being representable by a single pulse signal. The invented counter is not limited to this case, however; it can also accept integer values A greater than one.

Figure 1:
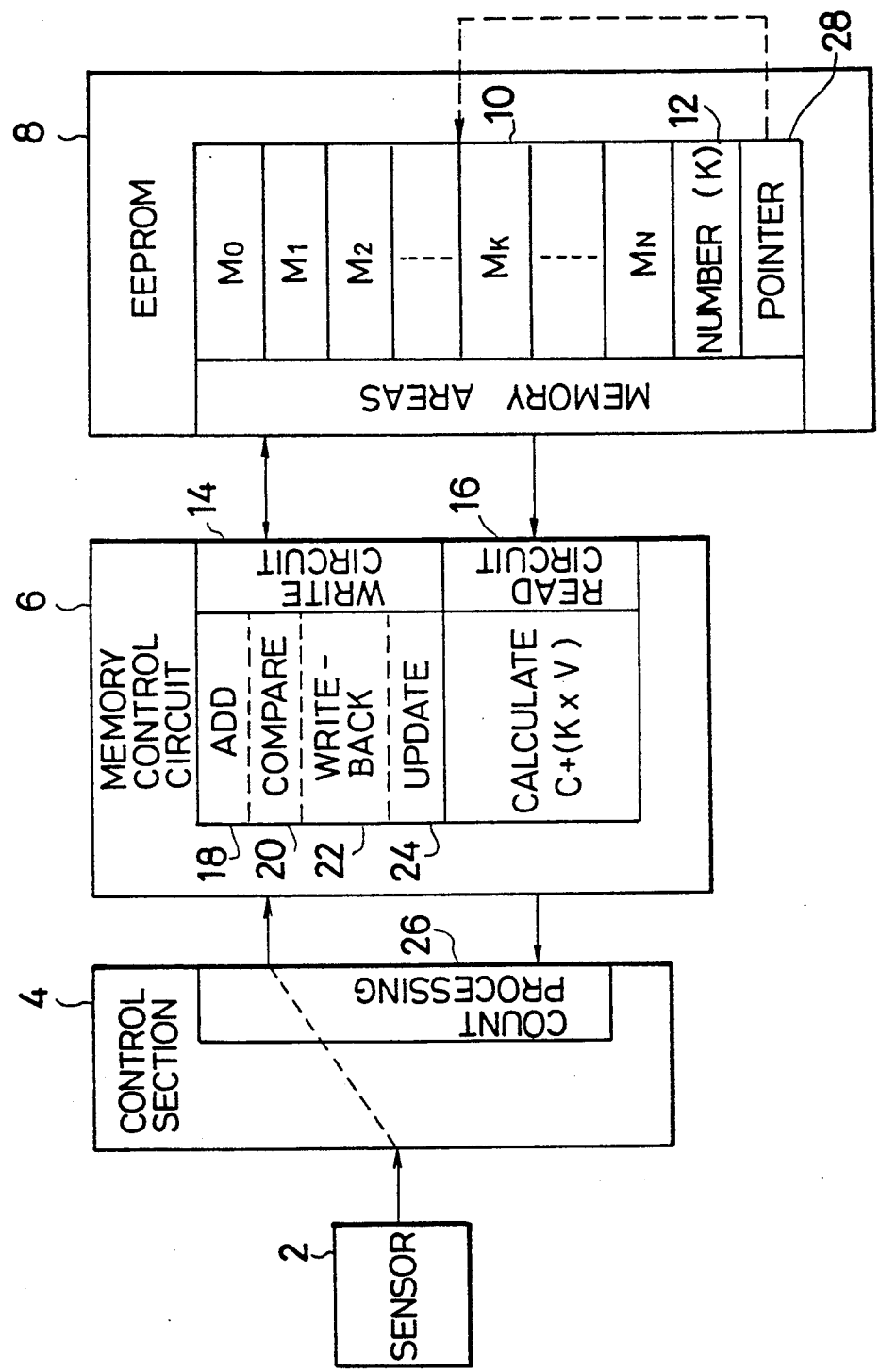
FIG. 1 is a block diagram of the invented counter.

With reference to FIG. 1, signals from the sensor 2 are routed through a control section 4 to a memory control circuit 6. The memory control circuit 6 reads and writes data in an EEPROM 8. The counter consists of the memory control circuit 6 and the EEPROM 8. The control section 4 controls the device, such as a page printer or copier, in which the counter is used.

The EEPROM 8 is a well-known semiconductor device comprising memory cells that can be read an unlimited number of times and written a limited number of times by means of electrical signals. The number of times the memory contents of a memory cell in the EEPROM can be rewritten reliably is specified by the EEPROM manufacturer, and will be denoted below by the symbol V. The memory cells in the EEPROM 8 retain their contents even when electrical power is not supplied.

The EEPROM 8 is divided into $N+1$ count areas 10, denoted $M_O$ to $M_N$ in the drawing, each having sufficient memory cells to store integer values from zero to V. An additional number area 12 has sufficient memory cells to store integer values from zero to N.

The memory control circuit 6 comprises a write circuit 14 and a read circuit 16. The write circuit 14 can read values from the EEPROM 8, perform arithmetic and logic operations on these values and the value A supplied by the sensor 2, and write values obtained as results back to the EEPROM 8. The read circuit 16 can read values from the EEPROM 8, perform arithmetic operations on these values, and provide the results as the output of the counter.

More specifically, the write circuit 14 has an add module 18 for reading the contents C of the K-th count area $M_K$ of the EEPROM 8, where K is the value stored in the number area 12, and adding A to the value of C to produce a sum $C+A$. The write circuit 14 also has a compare module 20 for comparing the sum $C+A$ with the value V, and a write-back module 22 for writing the sum $C+A$ in the Kth count area $M_K$. An update module 24 in the write circuit 14 writes the value $C+A-V$ in the $(K+1)$th count area $M_{K+1}$ and the value $K+1$ in the number area 12.

The update module 24 preferably also writes the value V in the K-th count area $M_K$. The update module 24 may be further adapted to set a flag bit in the K-th count area $M_K$ to indicate that the Kth count area $M_K$ is full.

The read circuit 16 reads the contents K of the number area 12 and the contents C of the Kth count area $M_K$, calculates $C+(K \times V)$, and provides the value of $C+(K \times V)$ as the output of the counter to count processing circuits 26 in the control section 4. In a page printer, for example, the processing circuits 26 include circuits that check the current count value and display messages asking the user to take necessary maintenance action.

In order to read the contents C of the Kth count area $M_K$, the write circuit 14 and the read circuit 16 must determine the address of the K-th count area $M_K$ in the EEPROM 8. Two possible address determination methods will be described below.

In the first method, the write circuit 14 and the read circuit 16 read the contents K of the number area and calculate the address of the Kth count area $M_K$ from the value of K. For example, if the area $M_O, M_1, M_2, \ldots$ are contiguous two-byte areas disposed in ascending address order, the write circuit 14 and the read circuit 16 can calculate the address of the Kth count area $M_K$ by doubling the value of K.

In the second address determination method, the EEPROM 8 has a pointer area 28 for storing the address of the Kth count area $M_K$, and the write circuit 14 and the read circuit 16 determine the address of the Kth count area $M_K$ simply by reading the contents of the pointer area 28. When $C+A \geq V$, the update module 24 in the write circuit 14 updates the contents of the pointer area 28 by writing the address of the (K+1)th count area $M_{K+1}$ in the pointer area 28. If the areas $M_0$, $M_1$, $M_2$, ... are disposed addresses ascending at regular intervals, the update module 24 can update the pointer area 28 by adding a fixed integer value to the contents of the pointer area 28.

Figure 2:
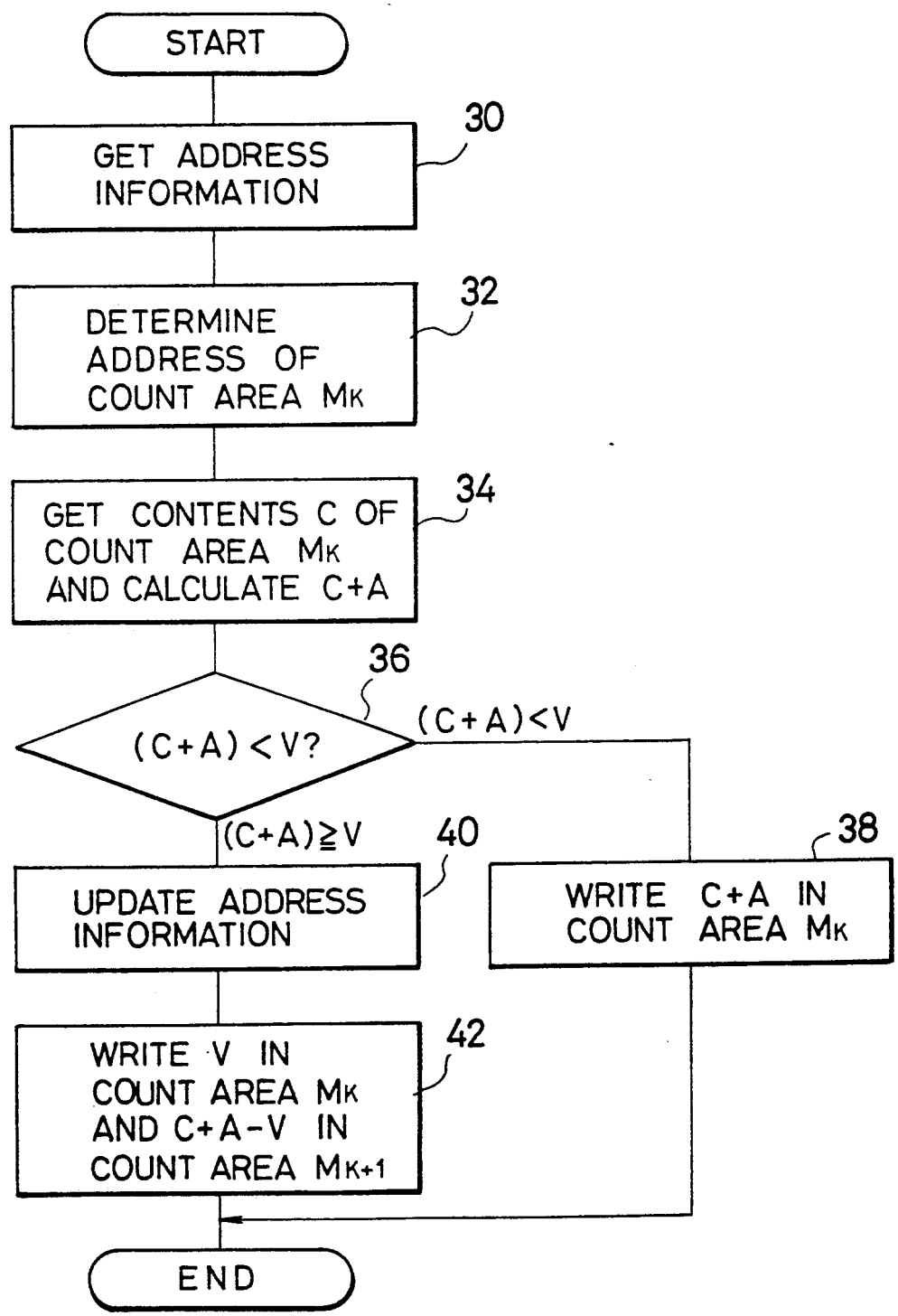
FIG. 2 is a flowchart of the count writing procedure.

Next the operation of the counter will be described with reference to flowcharts in FIGS. 2 and 3. The flowchart in FIG. 2 depicts the operation of the write circuit 14. The flowchart in FIG. 3 depicts the operation of the read circuit 16.

With reference to FIG. 2, when the write circuit 14 receives a value A from the sensor 2, it begins by obtaining address information from the EEPROM 8 (step 30). Specifically, the write circuit 14 reads the contents of the number area 12 if the first address determination method is adopted, or the contents of the pointer area 28 if the second address determination method is adopted. From this information, the write circuit 14 determines the address of the Kth count area $M_K$ as already described (step 32).

Next the add module 18 reads the contents C of the Kth count area $M_K$ and calculates the sum $C+A$ (step 34). The compare module 20 compares the sum $C+A$ with the value V (step 36). If $C+A<V$, the write-back module 22 is activated to write the sum $C+A$ back to the Kth count area $M_K$ (step 38).

If $C+A \geq V$, the update module 24 is activated to update the address information by writing the value $K+1$ in the number area 12 (step 40). If the second address determination method is adopted, the update module 24 also writes the address of the (K+1)th count area $M_{K+1}$ in the pointer area 28. Then the update module 24 writes the value V in the Kth count area $M_K$, and the value $C+A-V$ in the (K+1)th count area $M_{K+1}$ (step 42).

Completion of step 38 or step 42 ends the count writing procedure.

With reference to FIG. 3, when the control section 4 requests the current count value, the read circuit 16 begins by obtaining address information from the EEPROM 8 (step 44) and determining the address of the Kth count area $M_K$ (step 46). These two steps are identical to steps 30 and 32 in FIG. 2. Next, the read circuit 16 obtains the contents C of the Kth count area $M_K$ (step 48) and the contents K of the number area (step 50), and calculates $C+(K \times V)$ (step 52). This ends the count reading procedure. The value $C+(K \times V)$ is output to count processing circuits 26 in the control section 4 in FIG. 1.

Before the counter is used, values of zero are stored in all count areas $M_0$ to $M_N$, and in the number area 12. If the second address determination method is adopted, the address of the zero-th count area $M_0$ is stored in the pointer area 28.

When the value in the number area 12 reaches N, no further count areas beyond the current count area $M_N$ are available for storing counts. The memory control circuit 6 can be provided with a circuit that sends information to the control section 4 at this time, notifying the control section 4 that all count areas have been used. Alternatively, this information can be sent to the control section 4 when the value in the number area 12 is N and the compare module 20 finds that $C+A \geq V$.

By storing counts from zero to V in each of the count areas $M_0$, $M_1$, ..., $M_N$ the invented counter can count at least as high as $(N+1) \times V$, even though a given memory cell in the EEPROM 8 can be reliably rewritten only V times. If N is one thousand and V is ten thousand, for example, then the counter can count as high as ten million, which is more than adequate for counting the pages printed or copied by a page printer or copier during its service life.

The invented counter is compact and inexpensive. The EEPROM 8 can comprise a single semiconductor chip, or part of a single chip. No back-up battery is required. The memory control circuit 6 can also be implemented in a single semiconductor chip: either an application-specific integrated circuit, or a general-purpose single-chip microcomputer programmed to execute the functions of the write circuit 14 and the read circuit 16. It may be possible to implement the memory control circuit 6 and the EEPROM 8 on the same semiconductor chip. Alternatively, the memory control circuit 6 can be made part of the control section 4 of the page printer, copier, or other device in which the counter is used.

The counter described above can be modified in various ways without departing from the spirit and scope of the present invention. For example, functions common to both the write circuit 14 and the read circuit 16, such as reading the contents of the count, number, and pointer areas, can be provided in common modules shared by the write circuit 14 and the read circuit 16. In FIG. 3, if the contents K of the number area are obtained in step 44, then step 50 can be omitted.

What is claimed is:

1. A counter for counting events detected by a sensor, comprising:

an EEPROM having memory cells capable of being rewritten at least V times, said EEPROM comprising count areas $M_0$, ..., $M_N$ each having sufficient memory cells to store integer values from zero to V, the EEPROM further including a number area having sufficient memory cells to store integer values from 0 to N, where V and N are positive integers, where V represents a predetermined maximum number that may eventually be stored in each said count area;

a first circuit electrically connected to said EEPROM, effective for reading contents C of a Kth count area of said EEPROM, K being any value from zero to N, adding to said contents C a positive integer value A provided by said sensor to obtain a sum $C+A$, the first circuit also being configured so that if $C+A<V$, then it writes the sum $C+A$ in said Kth count area, but if $C+A \geq V$, then it writes $C+A-V$ in a (K+1)th count area and writes $K+1$ in said number area as a new value of K; and a second circuit electrically connected to said EEPROM and selectively operable for reading contents K of said number area and contents C of the Kth count area of said EEPROM, calculating $C+(K \times V)$, and providing $C+(K \times V)$ as the output of the counter.

2. The counter of claim 1 wherein, if $C+A \geq V$, said first circuit also writes the positive integer V in said Kth count area.

3. The counter of claim 1, wherein said read circuit and said first circuit read contents K of said number area and calculate therefrom an address of said Kth count area in said EEPROM.

4. The counter of claim 1, wherein said EEPROM has a pointer area for storing an address of said Kth count area, said read circuit and said first circuit read contents of said pointer area to determine the address of said Kth count area, and said first circuit updates contents of said pointer area when $C+A \geq V$ by writing therein an address of said $(K+1)$th count area of said EEPROM.

5. The counter of claim 4, wherein said first circuit updates contents of said pointer area by adding a fixed integer value thereto.

6. An EEPROM-based counter for counting events detected by a sensor, comprising:
an electrically erasable programmable read only memory (EEPROM) organized into $N+1$ count areas $M_O$ through $M_N$ and a number area for storing a value (K) pointing to one of said count areas;
a memory control circuit including a first circuit and a second circuit, and being coupled to read and write data in said EEPROM, and being coupled to receive data from the sensor;
said first circuit being coupled to said EEPROM, and being configured to read a first value (C) from said one of said count areas, to add said first value (C) to a second value (A) from said sensor to produce a first sum $(C+A)$, to compare said first sum with a third value (V), to write said first sum as a new value of said first value in said one of the count areas if said first sum is smaller than said third value (V), and to write a fourth value $(C+A-V)$ which is said first sum minus said third value in another one of said count areas as a new value of said first value if said first sum is equal to or larger than the third value and incrementing said value (K), (K) being a fifth value, so that said fifth value points to said another of said count areas;
said second circuit being coupled to said EEPROM, said second circuit being coupled to read said fifth value (K) from said number area and said first value (C) from said EEPROM, to calculate a second sum by multiplying said fifth value (K) and said third value (V) to produce a product and adding said product to said first value (C), and to provide said second sum as an output of the counter.

7. A counter for counting events detected by a sensor, comprising:
an electrically erasable programmable read only memory (EPROM) having memory cells capable of being rewritten V times;
said EEPROM including count areas $M_o, \ldots M_n$ and a number area;
said count areas each having sufficient memory cells to store integer values from zero to V, said number area having sufficient memory cells to store integer values from zero to N, V and N being positive integers, where V represents a predetermined maximum number that may eventually be stored in each said count area;
a first circuit electrically coupled to said EPROM to read contents C of a Kth count area of said EPROM, K being any value from zero to N;
said first circuit being responsive to an output of a compare module to write the sum $C+A$, A being a value received from the sensor, in said Kth count area, if the sum is less than V or to write $C+A-V$ in a $(K+1)$th count area and to write $K+1$ in the number area, if the sum is greater than or equal to V; and
a second circuit electrically coupled to said EPROM to read contents K of said number area and contents C of the Kth count area of said EPROM and to calculate $C+(K \times V)$ and to provide $C+(K \times V)$ as an output of the counter.

8. A method of operating a counter for counting events detected by a sensor comprising the steps of:
coupling an electrically erasable programmable read only memory (EEPROM) to a memory control circuit;
storing an address of a Kth count area in a pointer area in the EEPROM, K being any value from zero to N;
receiving in the memory control circuit a value A from a sensor and in response thereto: reading said address in said pointer area; reading contents C of the Kth count area; electronically calculating a sum $(C+A)$; electronically comparing the sum $(C+A)$ with a value V, V being a positive integer which represents a predetermined maximum number that may eventually be stored in each said count area; writing a sum $(C+A)$ in the Kth count area if $C+A<V$, but if $C+A \geq V$, then writing a value $(K+1)$ in a number area of said EEPROM, writing the value V in the Kth count area, writing the address of the $(K+1)$th count area in the pointer area, and writing a value $(C+A-V)$ in a $(K+1)$th count area;
outputting an accumulated count value by: reading contents K of the number area of said EEPROM; electronically calculating the address of said Kth count area of said EEPROM from a value of K; reading contents C of the Kth count area; electronically calculating $C+(K \times V)$; and outputting the value of $C+(K \times V)$ as the accumulated count value.

9. A method of operating a counter for counting events detected by a sensor according to claim 8 wherein said memory control circuit includes add, compare, write-back, update and calculate functions, and wherein:
said step of electronically calculating the sum $(C+A)$ is performed by said add function;
said step of electronically comparing the sum $(C+A)$ with the value V is performed by said compare function;
said step of writing the sum $(C+A)$ in the Kth count area if $C+A<V$ and said step of activating a write-back function of said write circuit to write the values $(K+1)$ in said number area, the value V in the Kth count area, the address of the $(K+1)$th count area in the pointer area and the value $(C+A-V)$ in the $(K+1)$th count area is performed by said write-back function; and
said step of electronically calculating $C+(K \times V)$ is performed by said read calculate function.

10. A method of operating a counter for counting events detected by a sensor comprising the steps of:
coupling an electrically erasable programmable read only memory (EEPROM) to a memory control circuit;

receiving in the memory control circuit a value A from the sensor, and in response thereto: reading contents K of a number area of said EEPROM, K being any value from zero to N, electronically calculating and address of a Kth count area of said EEPROM from a value of K, reading contents C of the Kth count area, electronically calculating a first sum (C+A), electronically comparing said first sum with a value V which is a positive integer representing a predetermined maximum number that may eventually be stored in each said count area, and writing said first sum (C+A) in the Kth count area if C+A<V, but if C+A≧V, then writing a value (K+1) in said number area of said EEPROM, writing the value V in the Kth count area, and writing a value (C+A−V) in a (K+1)th count area; and outputting an accumulated counted value by reading contents K of said number area of said EEPROM, electronically calculating the address of the Kth count area of said EEPROM from a value of K, reading contents C of the Kth count area electronically calculating C+(K×V), and outputting the value C+(K×V) as the accumulated counted value.

11. A method of operating a counter for counting events detected by a sensor according to claim 10, wherein said method includes operating functions of said memory control circuit, including add, compare, write-back, update, and calculate modules, and wherein:

said step of electronically calculating the sum (C+A) includes operating said add module;

said step of electronically comparing the sum (C+A) with a value V includes operating said compare module;

said step of writing the sum C+A includes operating said write-back module;

said step of writing the values K+1, V, and C+A−V includes operating said update module; and said step of electronically calculating C+(K×V) includes operating said calculate module of said memory control circuit.

* * * * *